(12) United States Patent
Jury et al.

(10) Patent No.: US 12,316,287 B1
(45) Date of Patent: May 27, 2025

(54) HIGH-PERFORMANCE AUDIO AMPLIFIER

(71) Applicant: Focal jmlab, La Talaudiere (FR)

(72) Inventors: Christian Jury, Sorbiers (FR); Ludovic Uhring-Cadart, Sorbiers (FR); Michel Marandon, L'etrat (FR)

(73) Assignee: FOCAL JMLAB, La Talaudiere (FR)

( * ) Notice: Subject to any disclaimer, the term of this patent is extended or adjusted under 35 U.S.C. 154(b) by 0 days.

(21) Appl. No.: 18/834,318

(22) PCT Filed: Jan. 25, 2023

(86) PCT No.: PCT/EP2023/051797
§ 371 (c)(1),
(2) Date: Jul. 30, 2024

(87) PCT Pub. No.: WO2023/144200
PCT Pub. Date: Aug. 3, 2023

(30) Foreign Application Priority Data

Jan. 31, 2022 (FR) ..................................... 2200839

(51) Int. Cl.
*H03F 3/183* (2006.01)
*H03F 1/02* (2006.01)
(Continued)

(52) U.S. Cl.
CPC ......... *H03F 3/3069* (2013.01); *H03F 1/0216* (2013.01); *H03F 3/183* (2013.01);
(Continued)

(58) Field of Classification Search
CPC ...... H03F 3/3069; H03F 1/0216; H03F 3/183; H03F 3/45112; H03F 2200/03; H03F 2200/129; H03F 2200/498; H03F 2200/93; H03F 2203/45496; H03F 2203/45528; H03F 2203/45598; H03F 2203/45601;
(Continued)

(56) References Cited

U.S. PATENT DOCUMENTS

| 3,974,455 | A | 8/1976 | Kamimura et al. | |
| 9,236,839 | B2 * | 1/2016 | Laplaca | ................ H03F 1/0244 |
| 2024/0223206 | A1 * | 7/2024 | Ramamurthy | .......... H03M 1/66 |

OTHER PUBLICATIONS

IPEA/EP European Patent Office, International Preliminary Report on Patentability for Corresponding International Application No. PCT/EP2023/051797 dated Aug. 6, 2024 in the English language (7 pgs).

(Continued)

*Primary Examiner* — Hieu P Nguyen
(74) *Attorney, Agent, or Firm* — Harris Beach Murtha Cullina PLLC

(57) ABSTRACT

The invention relates to a high-performance audio amplifier intended to control at least one loudspeaker, the amplifier comprising a pre-amplification stage that receives an input signal, a power amplification stage connected to the pre-amplification stage and a feedback that delivers to the pre-amplification stage an image of the output signal, the power amplification stage comprising two power supply circuits comprising a MOSFET transistor. The invention is characterized in that it comprises: a sub-circuit for assisting with charging, a sub-circuit for assisting with discharging said MOSFET transistor, and a voltage-shifting sub-circuit.

10 Claims, 17 Drawing Sheets

(51) Int. Cl.
*H03F 3/30* (2006.01)
*H03F 3/45* (2006.01)

(52) U.S. Cl.
CPC ...... *H03F 3/45112* (2013.01); *H03F 2200/03* (2013.01); *H03F 2200/129* (2013.01); *H03F 2200/498* (2013.01); *H03F 2200/93* (2013.01); *H03F 2203/45496* (2013.01); *H03F 2203/45528* (2013.01); *H03F 2203/45598* (2013.01); *H03F 2203/45601* (2013.01); *H03F 2203/45604* (2013.01); *H03F 2203/45698* (2013.01); *H03F 2203/45701* (2013.01); *H03F 2203/45718* (2013.01)

(58) Field of Classification Search
CPC . H03F 2203/45604; H03F 2203/45698; H03F 2203/45701; H03F 2203/45718
USPC .............................. 330/255, 297, 251, 207 A
See application file for complete search history.

(56) References Cited

OTHER PUBLICATIONS

ISA/EPO International Search Report and Written Opinion for corresponding International Application No. PCT/EP2023/051797 dated Jan. 25, 2023 (11 pages).
Paulinaacuna, "Amplifier—Wikipedia", Feb. 23, 2015, pp. 19-20.

\* cited by examiner

HIGH-PERFORMANCE AUDIO AMPLIFIER

CROSS-REFERENCE TO RELATED APPLICATIONS

This application is a national stage application under 35. U.S.C. § 371 of PCT Application No. PCT/EP2023/051797, filed on Jan. 25, 2023, which claims priority to, and the benefit of, French Application No. 2200839 filed on Jan. 31, 2022, the entire contents of each application being incorporated herein by reference thereto.

TECHNICAL FIELD

The invention relates to the field of amplifiers. The invention relates in particular to a high-power audio amplifier intended to control at least one loudspeaker.

High-power amplifiers have particular applications in providing sound in recording studios or concert halls. They are used in particular to power electrodynamic loudspeakers.

The invention advantageously makes it possible to obtain a high-power audio amplifier with better efficiency than amplifiers of the prior art, while guaranteeing low distortion.

PRIOR ART

Conventionally, a high-power amplifier comprises at least one active component such as a transistor or a tube making it possible to amplify the power of a signal received as input, while retaining the shape of the input signal.

The circuit of a high-power amplifier generally comprises a pre-amplification stage followed by a power amplification stage. More precisely, the output of the power amplification stage is fed back to the pre-amplification stage so that the pre-amplification stage detects, over time, the difference between the output signal and the input signal, for example by means of differential pairs. This difference detected at the pre-amplification stage is then amplified in the power amplification stage to form the output signal, which is conventionally transmitted to at least one loudspeaker.

Thus, by way of example, FIG. 1 illustrates a high-power amplifier 100 whose input signal is applied at point S1. The output of the high-power amplifier 100 powers a loudspeaker, represented by a resistor R44, connected between a point 3 and ground.

The diagram of the high-power amplifier 100 is symmetrical; it comprises as well an upper part 140a, which amplifies the positive half-wave of the input signal S1, and a lower part 140b, which amplifies the negative half-wave of the input signal S1.

In the example of FIG. 1, the high-power amplifier 100 is powered by a single voltage level of +/−65 V.

The pre-amplification stage 201 comprises two differential pairs 110a, 110b each comprising two transistors Q1, Q2 and Q3, Q4 assembled mirroring each other. Thus, the emitter of the transistors Q1, Q2 is connected to the −65V power bus via a resistor R2, R3 and a first constant current source I, while the emitter of the transistors Q3, Q4 is connected to the +65V power bus via a resistor R4, R5 and a second current source of same value I.

The collector of the transistors Q2, Q4 is respectively connected to the +65V and −65V power bus, while the collector of transistors Q1, Q3 is respectively connected to the +65V and −65V power bus via a resistor R1, R11. In the absence of feedback, the gain of the pre-amplification stage 201 depends on the ratio of the resistors R1/R2 and R11/R4.

The bases of the transistors Q1 and Q3 and the bases of the transistors Q2 and Q4 are connected to each other. The bases of the transistors Q1 and Q3 are also powered by the input signal S1. The bases of the transistors Q2 and Q4 are connected to the loudspeaker R44 via a resistor R18, so as to form the feedback applied to the pre-amplification stage. The collectors of the transistors Q1 and Q3 ensure the coupling of the pre-amplification stage 201 with the power amplification stage 202.

The power amplification stage 202 comprises two transistors Q8, Q9 connected by their respective bases to the pre-amplification stage 201 via a resistor R23, R57. A voltage source T1 is also placed between the resistors R23 and R57 so as to bias the transistors Q8, Q9 in class AB. This voltage source T1 makes it possible to supply a voltage equal to the sum of the voltages necessary to turn on the transistors Q8 and Q9.

The transistors Q8, Q9 are also connected respectively to the +65 V and −65V power buses by their collector. The emitter of the transistors Q8, Q9 is connected to the loudspeaker R44 via resistors R16, R17. These resistors R16 and R17 are added in order to control the quiescent current, that is to say the value of the current conducted by the amplifier when it does not receive any input signal. Without these resistors R16, R17, the quiescent current would depend on the characteristics of the transistors Q8 and Q9 and the temperature, which is prohibitive.

In addition, the circuit in FIG. 1 has a particularity at the bases of the transistors Q2 and Q4. In fact, the latter are connected to a protection line 403 comprising a resistor R28 assembled in series with a capacitor C4 connected to ground. This assembly is a voltage divider such that the voltage at point S2 is equal to R28/(R18+R28) multiplied by the voltage of the output signal 3 in AC. In practice, the capacitor C4 behaves like a short circuit when the voltage running through the circuit is alternating. On the other hand, when the voltage running through the circuit is DC, the capacitor C4 behaves like an open circuit. In this case, the output signal 3 of the high-power amplifier 100 is directly connected to point S2. The voltage gain of the high-power amplifier 100 is then equal to 1, which makes it possible to limit a possible undesirable DC component on the voltage applied at the terminals of the loudspeaker R44.

In this type of amplifier, the voltage measured relative to ground at point S1 and the voltage measured relative to ground at point S2 are equal. In other words, the gain of the high-power amplifier 100 is equal to the ratio of the values of the resistors (R18+R28)/R28.

FIG. 1 therefore illustrates a high-power voltage amplifier. There is also another category, high-power current amplifiers, as shown in FIG. 2.

This category of high-power current amplifiers 101 has the same topology as for the high-power voltage amplifiers 100, namely a pre-amplification stage 201 coupled to an amplification stage 203.

Unlike the high-voltage amplifier 100 of FIG. 1, a current measurement resistor R6 is inserted between the loudspeaker R44 and ground. Furthermore, the current amplifier 101 does not have a protection line 403. The bases of the transistors Q2 and Q4 are connected to an interconnection point P1 located between the resistor R6 and the loudspeaker R44.

In this configuration, an image of the current applied at point S2 in FIG. 3 therefore crosses the loudspeaker R44. It follows that the transconductance, that is to say the ratio between the output current passing through the loudspeaker R44 and the input voltage applied at point S1 of the amplifier 101 is equal to 1/R6 A/V. For a loudspeaker with impedance Z, the voltage gain is Z/R6.

The voltage or current amplification assemblies are therefore similar, particularly with regard to the pre-amplification stage and the power amplification stage. They only differ with regard to the loudspeaker connection and the feedback.

In the following prior art, the other classes of amplifiers will be described with reference to voltage amplifiers, although the invention is not limited to this type of amplifier.

A class system can be used to characterize different high-power amplifier topologies. The class system assigns a letter based on the relationship between the shape of the input signal and the shape of the output signal, as well as the duration for which active components are used during the amplification of the input signal.

Among the existing amplifier classes, class A amplifiers have a topology such that the active components conduct, in the absence of an input signal, a high current of approximately 50% of the maximum output current. This is called quiescent current. In modulation, the latter is superimposed on the output current. This type of amplifier can provide excellent sound quality, but it has the disadvantage of generating significant heat dissipation. Thus, the energy efficiency, defined by the ratio between the effective output power and the absorbed power, of this class of amplifiers is approximately 10%.

Class B amplifiers feature a topology such that the active components conduct over 50% of the input signal period when a sinusoidal input signal is applied as input. For this class of amplifiers, the quiescent current is zero. The efficiency of this type of amplifier is higher than class A amplifiers, but the distortion characteristics of the output signal are significantly degraded compared to class A amplifiers. Class B amplifiers therefore produce poorer quality sound. It is now quite rare for manufacturers to use this class of amplifier.

Class AB amplifiers feature a topology such that the active components conduct over 100% of the input signal period but with a low quiescent current of approximately 1% of the maximum output current. This type of amplifier has higher energy efficiency than class A amplifiers, typically between 30 and 50%, but lower sound quality. Class AB amplifiers are therefore a good compromise between performance and energy efficiency.

For class D amplifiers, a technology where the active components are operated like switches is used. The signal is then converted by pulse width modulation. This system increases energy efficiency to around 70%. On the other hand, the output signal contains more noise and distortion and it is difficult to reproduce high frequencies with this class of amplifiers.

Class G amplifiers have several power buses and can switch from one to another depending on the power output demand. This makes it possible to increase the energy efficiency by reducing the power dissipated in the active components.

Class H amplifiers use a power bus whose supply voltage "follows" or is modulated by the input signal. Typically, they have two power buses, like those of class G, but only the highest supply voltage is modulated. The modulated power supply is generally achieved using a class D amplifier.

The subject matter of the invention relates in particular to these last two categories of amplifiers.

FIG. 3 illustrates the upper part of a power amplification stage 204. The latter is connected to a power supply circuit 150. Of course, this power amplification stage also comprises a lower part, not shown, mirroring the upper part with an equivalent power supply circuit. Likewise, the circuit also comprises a pre-amplification stage, for example connected to an independent power supply or to a strong power bus, also connected to the power supply circuit 150.

The power supply circuit 150 makes it possible to select a power level of the power amplification stage 204 adapted to the amplification power demand. Thus, when the amplification voltage is greater than a threshold value, the first strong power bus must be used whereas, when the amplification voltage is lower than this threshold value, a second weaker power bus can be used. The lower power bus usage phases improve the overall efficiency of the amplifier compared to class A, B, and AB amplifiers.

Furthermore, the power supply circuit 150 has a structure independent of the pre-amplification stage 201 and the power amplification stage 204. In the example of FIG. 3, the power amplification stage 204 comprises a transistor Q10 whose base is connected to the emitter of the transistor Q8. This so-called "Darlington" configuration makes it possible to increase the current gain. The emitters of the transistors Q8 and Q10 are coupled to the loudspeaker R44 by their respective resistors R16 and R19. They have, for example, a respective quiescent currents equal to 6 mA for the transistor Q8 and equal to 75 mA for the transistor Q10.

The power amplification stage 204 is connected to the power supply circuit 150 at the collectors of the transistors Q8 and Q10. This power supply circuit 150 is connected to two voltage buses having distinct levels V+, V++. The power supply circuit 150 therefore makes it possible to select one or the other of these voltage levels depending on the amplification demand. Typically, a first power bus delivers 65 V and a second power bus delivers 35 V. The second power bus is intended to be used to power the power amplification stage 204 when the output signal to be generated does not have a very high voltage, typically less than 32 V.

Due to the relatively low current passing through the transistor Q8, typically less than 10% of the current passing through the transistor Q10, the collector of the transistor Q8 can be directly connected to the first power bus V++, without this causing significant additional power dissipation. This embodiment can improve the stability of the amplifier, which operation as a current amplifier tends to undermine.

In order to select the appropriate voltage level, a MOSFET transistor M1 is directly connected to the first power bus V++ by its drain and to the second power bus V+ by its source via a fourth diode D3. The MOSFET transistor M1 typically switches for a threshold of 27 V, then it operates linearly beyond this threshold. It lets the first power bus V++ pass when a control voltage greater than a threshold value is applied at it. This voltage is controlled by the association of the first diode D8, D10, which is connected between the gate of the MOSFET transistor M1 and the loudspeaker R44, and a second resistor R8, R27, which is connected between the drain and the gate of the MOSFET transistor M1.

A diode D15 is connected between the collector of the transistor Q10 and the loudspeaker R44, the cathode of the diode being connected to the collector of the transistor Q10.

The different signals obtained with this assembly are illustrated in FIG. 4.

Thus, the signal numbered 1 in FIGS. 3 and 4 represents the gate signal of the MOSFET transistor M1. The output signal numbered 3 in FIGS. 3 and 4 represents the output signal of the amplifier, that is to say the signal at the terminals of the loudspeaker R44. The output signal numbered 2 in FIGS. 3 and 4 represents the output signal of the power supply circuit 150. We thus notice that the output signal 3 is distorted. Indeed, the crest of the sinusoid is flattened and shifts occur around 27 µs. This saturation of output signal 3 is explained by the fact that the supply voltage of the MOSFET transistor M1 is insufficient for the amplifier to be able to deliver the output voltage correctly.

Likewise, the signal 2 has, between 40 and 47 µs, an abnormal voltage peak corresponding to an overvoltage at the gate of MOSFET transistor M1. This leads to a loss of power and a degradation in the efficiency of the amplifier.

The technical problem that the invention proposes to solve is therefore to obtain a high-power audio amplifier making it possible to limit the distortions identified on the signals and therefore to improve the efficiency and reduce the saturation of the amplifier.

DISCLOSURE OF THE INVENTION

To solve this problem, the invention proposes a power supply circuit comprising a MOSFET transistor controlled by a sub-circuit for assisting with charging, a sub-circuit for assisting with discharging and a voltage-shifting sub-circuit, making it possible to obtain better efficiency of the amplifier while limiting saturation and distortion of the amplifier output signal.

In other words, the invention relates to a high-power audio amplifier intended to control at least one loudspeaker, said amplifier comprising:

a pre-amplification stage receiving an input signal;
a power amplification stage connected to the pre-amplification stage and providing an output signal intended to power said at least one loudspeaker; the pre-amplification and power amplification stages having a mirror-mounted upper part and lower part;
feedback providing the pre-amplification stage with an image of the output signal,
an upper power supply circuit, connected to the upper part of the power amplification stage, and allowing it to be powered by a first or a second power bus;
a lower power supply circuit connected to the lower part of the power amplification stage and allowing it to be powered by a first or a second power bus;
each power supply circuit comprising a MOSFET transistor and monitoring means, the MOSFET transistor being controlled by the monitoring means so as to carry out switching between one or the other of the two power buses, the MOSFET transistor being connected to the second power bus via a fourth diode, a first terminal of which is connected to the source of the MOSFET transistor, and the drain of the MOSFET transistor being connected to the first power bus.

The invention is characterized in that each power supply circuit further comprises:

a sub-circuit for assisting with charging said MOSFET transistor comprising at least a first resistor, a first terminal of the first resistor being connected to the gate of the MOSFET transistor and a second terminal of the first resistor being connected to an interconnection point;
a sub-circuit for assisting with discharging said MOSFET transistor comprising at least a second and a third resistor and a bipolar transistor; the base of the bipolar transistor being connected to a first terminal of the third resistor, its emitter being connected to the gate of the MOSFET transistor and its collector being connected to the source of the MOSFET transistor via the second resistor, the second terminal of the third resistor being connected to the interconnection point; and
a voltage-shifting sub-circuit comprising a first diode mounted in parallel with a first capacitor; a first terminal of the first diode and a first terminal of the first capacitor being connected to a first interconnection node; a second terminal of the first diode and a second terminal of the first capacitor being connected to a second interconnection node.

In particular, the sub-circuit for assisting with charging allows the MOSFET transistor to charge faster. Indeed, it comprises first of all the first resistor, which preferably has a resistance of high value so as not to exchange too much energy with the output of the amplifier and generate more distortion, i.e. approximately 15 kΩ. This first resistor only allows a low current to run to charge or discharge the gate of the MOSFET transistor. The gate behaves like a capacitor, however, the combination of the MOSFET transistor with the first resistor increases the duration of the charging and discharging times.

The sub-circuit for assisting with discharging allows the MOSFET transistor to discharge faster. The bipolar transistor makes it possible in particular to discharge the gate of the MOSFET transistor when the sinusoidal input signal is in its decreasing phase.

The voltage-shifting sub-circuit ensures that the gate potential of the MOSFET transistor is always higher than that of the amplifier output. Typically, the gate potential of the MOSFET transistor can be 15 V higher than that of the amplifier output. The voltage-shifting sub-circuit also compensates for voltage drops in the MOSFET transistor.

According to a second embodiment, the voltage-shifting sub-circuit further comprises at least a fourth resistor and a second diode, mounted in parallel. A first terminal of the second diode and a terminal of the fourth resistor are connected to the first interconnection node, a second terminal of the fourth resistor and a second terminal of the second diode being connected to a third interconnection node.

The addition of these components makes it possible to reduce the distortions observed on the amplifier output signal. This improvement in distortion is effective for a sinusoidal input signal, if it is of relatively low frequency, that is to say around 1 kHz.

Advantageously, according to a third embodiment, the sub-circuit for assisting with charging further comprises a fifth resistor mounted in series with a third diode, the fifth resistor and the third diode being mounted in parallel with the branch of the sub-circuit for assisting with charging including the first resistor.

The third diode, which is mounted in parallel with the first resistor, allows the current intended to charge the gate of the MOSFET transistor to run and to block the current intended to discharge the gate of the MOSFET transistor. The fifth resistor is preferably of low value, that is to say approximately 300Ω. This fifth resistor makes it possible to charge the gate of the MOSFET transistor much faster, since the charging time constant is equal to the product of the resistance and the capacitance.

The addition of these components here again makes it possible to improve the distortion for a sinusoidal input signal up to a frequency of 20 kHz. Distortion is therefore improved across the entire frequency spectrum. The sound reproduction of a loudspeaker connected to the amplifier of the invention is therefore improved. The listener perceives less distortion compared to amplifiers of the prior art.

According to a fourth embodiment, the voltage-shifting sub-circuit further comprises a second capacitor and a third capacitor, the second capacitor being mounted in parallel with the first capacitor and the first diode and the third capacitor being mounted in parallel with the third diode and the fifth resistor. These additional components make it possible to limit disturbances, that is to say interference signals superimposed on the expected output signal.

In practice, each power supply circuit comprises a first protection diode, a first terminal of which is connected to the source of the MOSFET transistor and a second terminal of which is connected to the gate of the MOSFET transistor. Likewise, each power supply circuit further comprises a second protection diode connected between the source and the drain of the MOSFET transistor.

The first protection diode is added in order to protect the MOSFET transistor from overvoltages on its gate, which could damage it or even make it unusable, by breaking the insulation between the gate and the channel which can only withstand +/−20 V continuously and +/−30 V transiently.

The role of the second protection diode is to protect the MOSFET transistor from a reverse drain-source voltage which could occur if the voltage of the first power bus only appears after that of the second power bus. The different power buses each have their own transformer windings and smoothing capacitors, hence different time constants.

According to a fifth embodiment, each power supply circuit further comprises a capacitor mounted in parallel with the fourth diode. This capacitor makes it possible to eliminate the interference peaks generated by the diode, a first terminal of which is connected to the source of the MOSFET transistor, when the latter switches. The harmonic distortion (THD) is also improved. This harmonic distortion is a measure of the linearity of the processing carried out. It is calculated by comparing the output signal of a device with a perfectly sinusoidal input signal.

In practice, the pre-amplification stage is connected to the first power bus of each power supply circuit via a circuit for damping power variations of said first power bus, said power variation damping circuit comprising at least one capacitor and at least one resistor mounted as a low-pass filter. In other words, the resistor is connected in series with the capacitor, which is connected to ground.

This assembly makes it possible to isolate noise and voltage dips. This phenomenon occurs in particular when the high-voltage amplifier delivers a high current. The capacitor then plays the role of an energy reservoir.

Advantageously, said power variation damping circuit further comprises an additional capacitor mounted in parallel with the at least one capacitor. The capacitor mounted in parallel has a more modest value, typically lower by a factor of $10^3$. It enables one to suppress high-frequency interference.

According to a specific embodiment of the invention, the feedback applied to the pre-amplification stage supplies a signal proportional to the current passing through the loudspeaker. This embodiment makes it possible to obtain a high-power current amplifier. As described with reference to FIG. 2 of the prior art, this category of high-power current amplifiers has the same topology as for high-power voltage amplifiers, namely a pre-amplification stage coupled to an amplification stage. However, the feedback applied to the pre-amplification stage differs.

By using the power supply circuit of the invention for a high-power current amplifier, the high-power current amplifier has very limited consumption.

Indeed, when the amplifier delivers a low voltage, the power supply circuit of the invention will not be active. Thus, the power supplied by the power supply will be equal to the product of the output current multiplied by the voltage delivered by the power bus of lower power, instead of the maximum voltage delivered by the single power bus for a standard class AB amplifier. At equal power, and assuming for example that the voltage delivered by the lower power power bus is equal to half that of the higher power power bus, half as much power will be supplied by the power supply. The transistors, which dissipate the difference between the power supplied by the power supply and the power supplied to the loudspeaker, will heat up significantly less.

BRIEF DESCRIPTION OF THE FIGURES

The manner of embodying the invention, as well as the advantages which result therefrom, will appear clearly from the description of the following embodiments, in support of the appended figures in which.

DETAILED DESCRIPTION OF THE EMBODIMENTS

Figure 1:
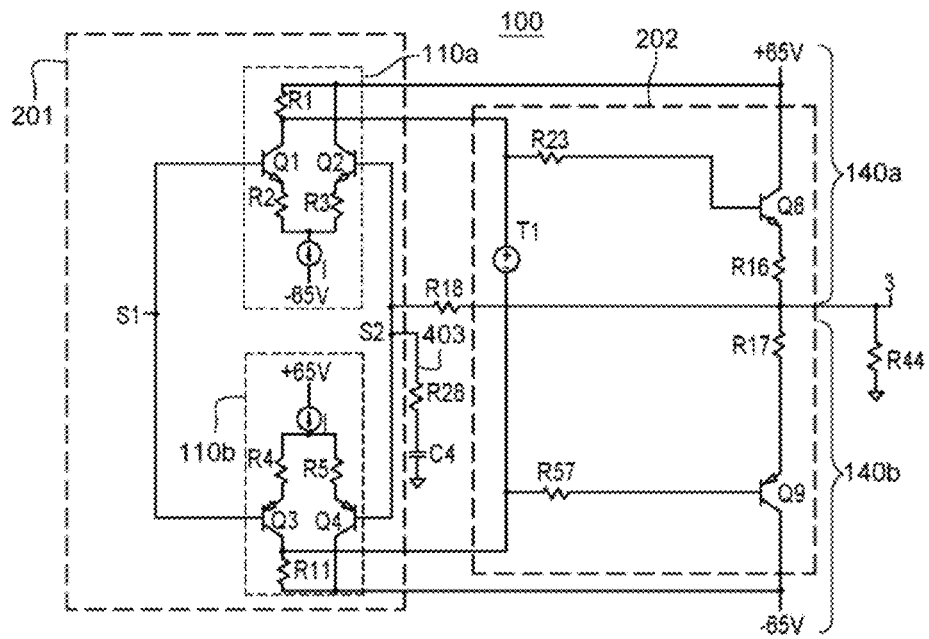
FIG. 1 is an electrical diagram of a high-power voltage amplifier of the prior art.
Figure 2:
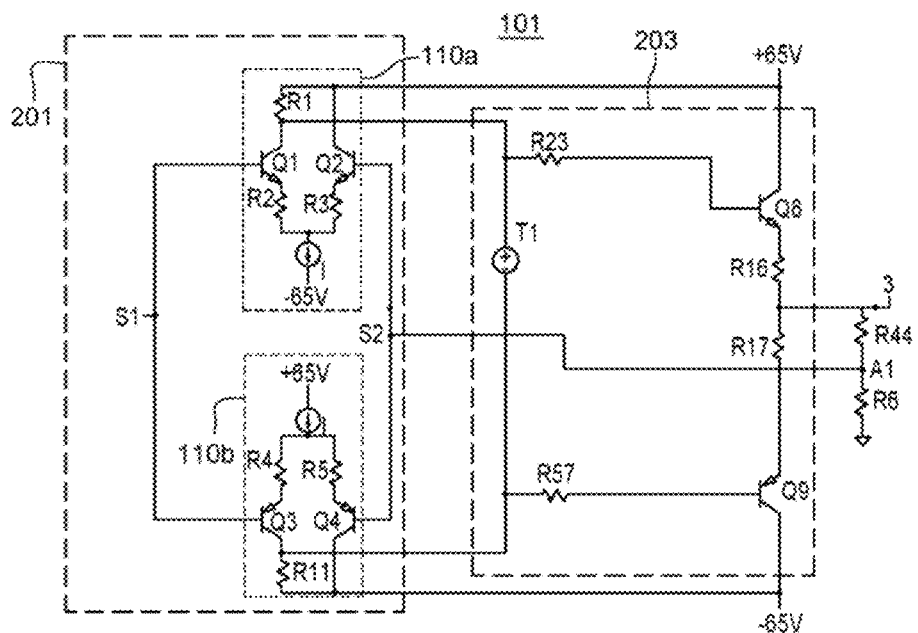
FIG. 2 is an electrical diagram of a high-power current amplifier of the prior art.
Figure 3:
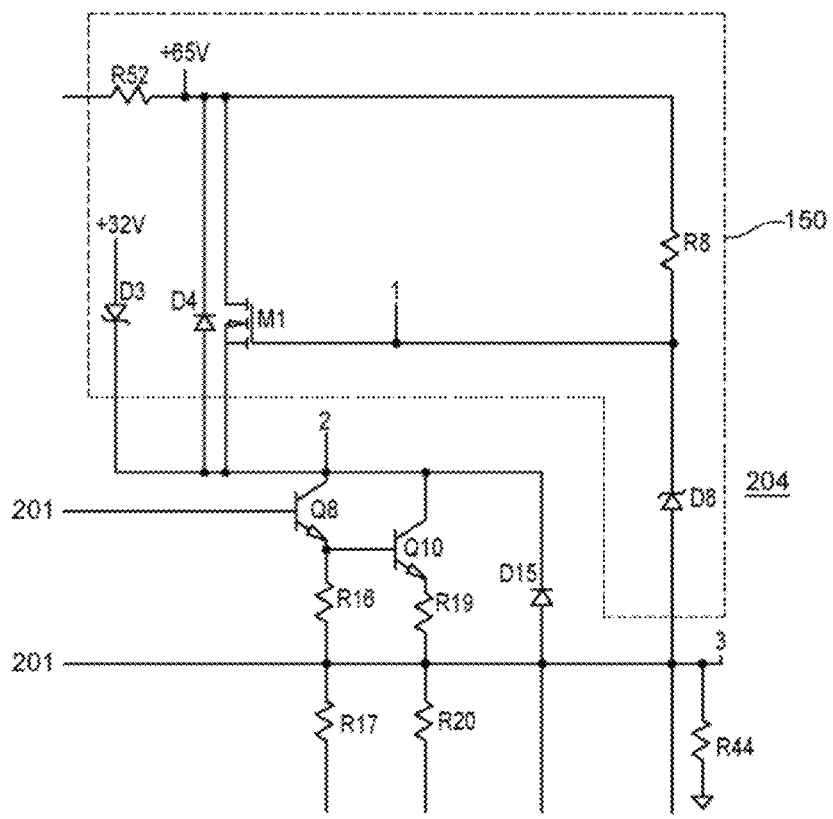
FIG. 3 is an electrical diagram of a high-power voltage amplifier of the prior art comprising a power supply stage.
Figure 4:
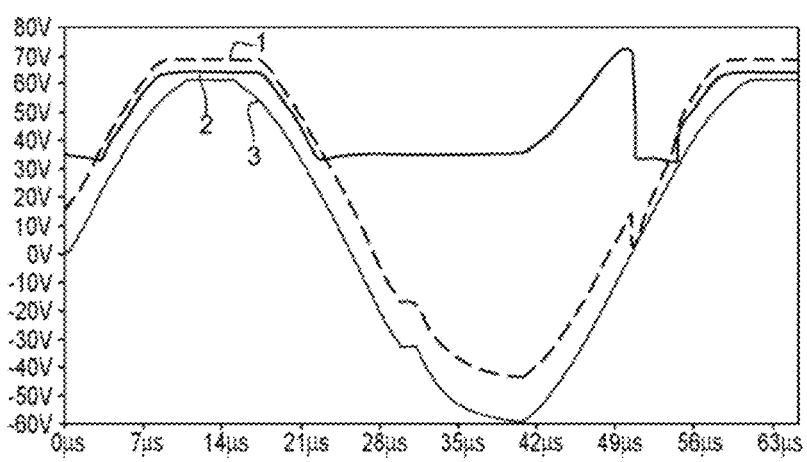
FIG. 4 is a graph representing the evolution of the gate voltage of the MOSFET transistor, the output voltage of the amplifier, and the output signal of the power supply circuit for the circuit of FIG. 3.
Figure 5A:
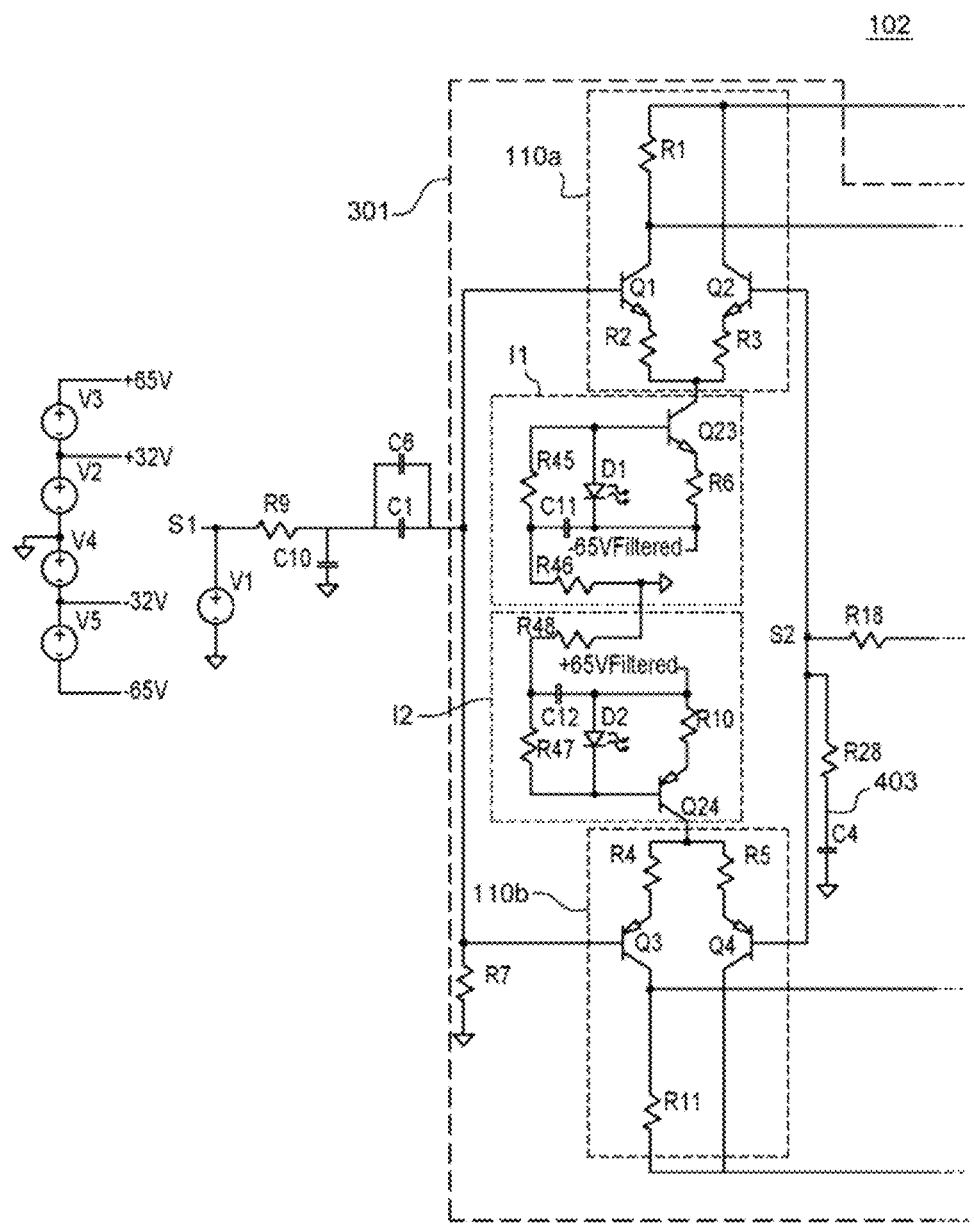
FIG. 5a and [FIG. 5b] are electrical diagrams of the high-power voltage amplifier according to one embodiment of the invention.
Figure 5B:
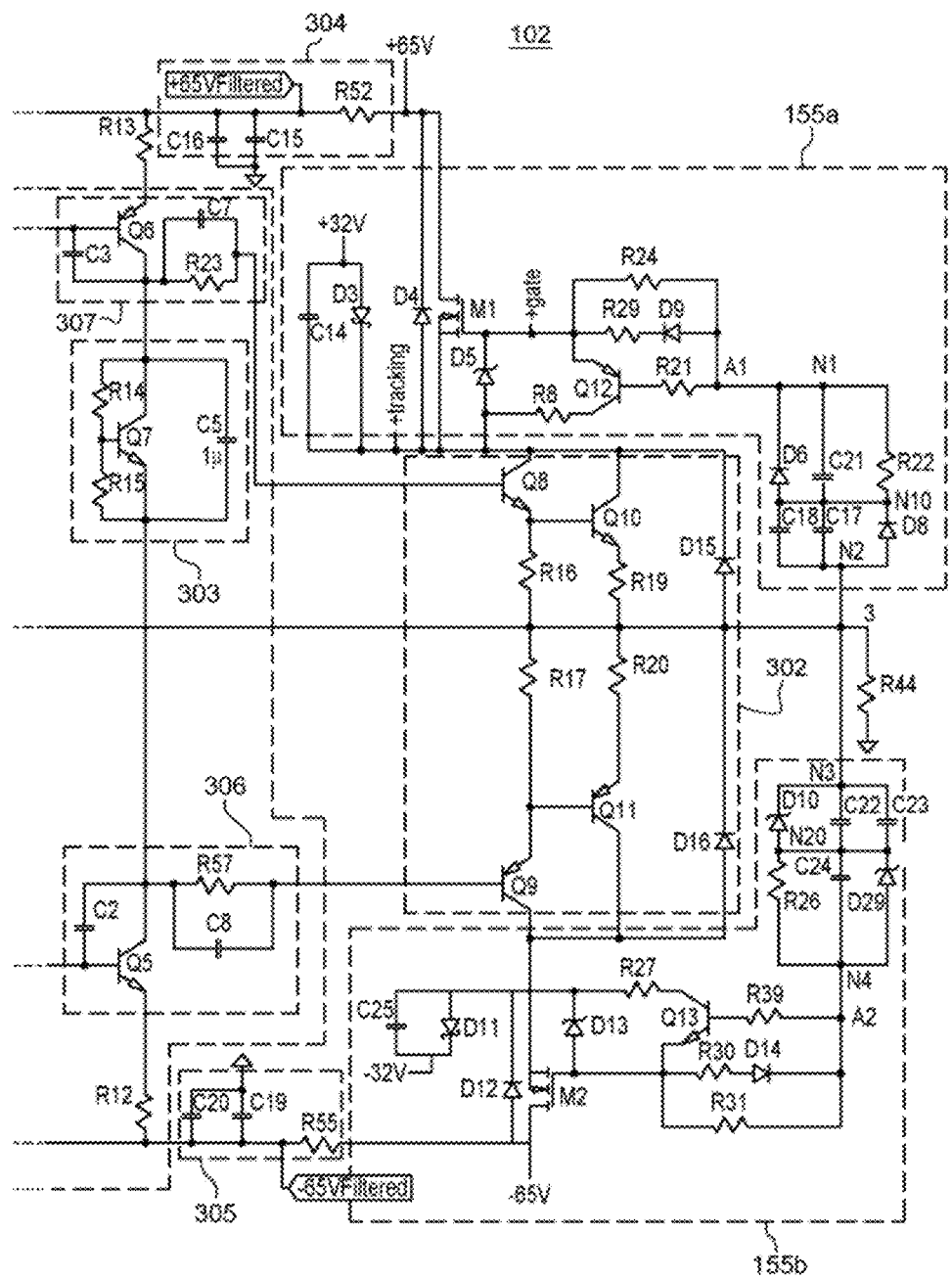

As illustrated in FIG. 5a-5b, the high-power amplifier 102 of the invention is symmetrical, it comprises an upper part, which amplifies the positive half-wave of the input signal S1, and a lower part, which amplifies the negative half-wave of the input signal S1.

The high-power amplifier 102 comprises a pre-amplification stage that receives the input signal S1 and supplies signals coming from the collector of transistors Q5, Q6, via a network consisting of the resistor R23, R57, mounted in parallel with a capacitor C7, C8. These signals are supplied to a power amplification stage 302 based on transistor Q8, Q9. The latter supplies an output signal 3 intended to power a loudspeaker R44. A feedback supplies the pre-amplification stage 201 with an image of the output signal 3.

The high-power amplifier 102 also comprises an upper power supply circuit 155a, which is connected to the upper part of the power amplification stage 302, and a lower power supply circuit 155b, which is connected to the lower part of the power amplification stage 302.

The pre-amplification stage 301 comprises two differential pairs 110a, 110b each comprising two transistors Q1, Q2 and Q3, Q4 mounted mirroring each other. Thus, the emitter of the transistors Q1, Q2 is connected to the −65V power bus via a resistor R2, R3 and a first constant current source I1, while the emitter of the transistors Q3, Q4 is connected to the +65V power bus via a resistor R4, R5 and a second current source of the same value I1.

The current sources I1 and I2 each comprise a transistor Q23, Q24 whose collector is respectively connected to the resistors R2, R3 and R4, R5. The emitter of the transistors Q23, Q24 is connected to a resistor R6, R10. The second terminal of the resistor R6 is connected on the one hand to the −65V power bus and on the other hand to ground, via a capacitor C11 mounted in series with a resistor R46. The second terminal of the resistor R10 is connected on the one hand to the +65V power bus and on the other hand to ground, via a capacitor C12 mounted in series with a resistor R48.

A diode D1, D2 is mounted between the base of the transistor Q23, Q24 and the second terminal of the resistor R6, R10, while a resistor R45, R47 is mounted between the base of the transistor Q23, Q24 and the interconnection point between the capacitor C11, C12 and the resistor R46, R48.

The collector of the transistors Q2, Q4 can be directly connected, respectively, to the +65V and −65V power bus. Alternatively, the collector of the transistors Q2, Q4 can be connected, respectively, to the +65V and −65V power bus via a power variation damping circuit 304, 305.

The power variation damping circuit 304, 305 comprises a resistor R52, R55 mounted in series with a capacitor C15, C19 which is connected to ground. The second terminal of the resistor R52, R55 is connected to the +/−65V power bus. Advantageously, another capacitor C16, C20 can be mounted in parallel with the capacitor C15, C19. In practice, the capacitor C15, C19 has a value between 150 and 300 μF, while the capacitor C16, C20 has a value between 150 and 300 nF.

The collector of the transistors Q1, Q3 is respectively connected to the +65V and −65V power bus via a resistor R1, R11 and advantageously via the power variation damping circuit 304, 305. In the absence of feedback, the gain of the first pre-amplification stage 102 depends on the ratio of the resistors R1/R2 and R11/R4.

The bases of the transistors Q1 and Q3 are connected to each other and connected to ground via a resistor R7. The bases of the transistors Q2 and Q4 are also connected to each other. The bases of the transistors Q1 and Q3 are supplied with the input signal S1. The voltage source V1, connected between the point S1 and ground, represents the generator of the input signal S1. An intermediate filter circuit can be inserted between the input signal S1 and the bases of the transistors Q1 and Q3. This circuit comprises for example a band-pass filter comprising a resistor R9 and a capacitor C10 which is connected to ground, and two capacitors C1, C6, mounted in parallel.

The bases of the transistors Q2 and Q4 are connected to the loudspeaker R44 via a resistor R18, so as to form the feedback applied to the pre-amplification stage 301. The collectors of the transistors Q1 and Q3 ensure the coupling of the pre-amplification stage 301 with the circuits 306, 303, 307 and the resistors R12, R13.

The power amplification stage 302 comprises two transistors Q8, Q9 connected by their respective bases to the pre-amplification stage 301 via the circuit 306, 307.

The circuit 306, 307 comprises a transistor Q5, Q6 whose emitter is connected to the +/−65V voltage bus via a resistor R12, R13 and whose base is connected to the collector of the transistors Q1, Q3. A capacitor C2, C3 is connected between the base and the collector of the transistors Q5, Q6 in order to improve the stability of the amplifier. The collector of the transistors Q5, Q6 is connected, on the one hand, to a resistor R57, R23 mounted in parallel with a capacitor C8, C7 and, on the other hand, to a bias circuit 303. The latter comprises a transistor Q7 whose emitter is connected to the collector of the transistor Q5 and whose collector is connected to the collector of the transistor Q6. A resistor R14 is mounted between the collector and the base of the transistor Q7 and another resistor R15 is mounted between the emitter and the base of transistor Q7. Finally, a capacitor C5, for example having a value of 1 μF, is connected between the emitter and the collector of the transistor Q7. This capacitor C5 improves the stability of the amplifier. Alternatively, the resistor R13, R12 can be connected, respectively, to the +65V and −65V power bus via a power variation damping circuit 304, 305.

The circuits 306, 307 carry out a second voltage amplification. The gain of this amplification is proportional to the ratio of the resistance "seen by the collector" to that present on the emitter of Q5, Q6. When one of the transistors Q5, Q6 conducts, its dual is blocked; the transistor which is conducting therefore sees a very high resistance hence a very significant voltage gain.

The power amplification stage 302 further comprises two transistors Q10, Q11 whose bases are respectively connected to the emitter of the transistors Q8 and Q9. This so-called "Darlington" configuration makes it possible to increase the current gain. The emitters of the transistors Q8 and Q10 are coupled to the loudspeaker R44 by their respective resistors R16 and R19, while the emitters of the transistors Q9 and Q11 are coupled to the loudspeaker R44 by their respective resistors R17 and R20. For example, they have a respective quiescent current equal to 6 mA for the transistors Q8, Q9 and equal to 75 mA for the transistors Q10, Q11.

The power amplification stage 302 is connected to two power supply circuits 155a, 155b at the site of the collectors of the transistors Q8-Q11. These power supply circuits 155a, 155b are connected to two voltage buses having distinct levels V+, V++. The power supply circuit 155a, 155b therefore makes it possible to select one or the other of these voltage levels depending on the amplification demand. Typically, a first power bus delivers +/−65V and a second power bus delivers +/−35V. The second power bus is intended to be used to power the power amplification stage 302 when the output signal to be generated does not have a very high voltage, typically less than 27 V.

Due to the relatively low current passing through the transistors Q8 and Q9, typically less than 10% of the current passing through the transistors Q10 and Q11, the collectors of Q8 and Q9 can be directly connected to the first power bus V++ without this causing significant additional power dissipation. This embodiment improves the stability of the amplifier in terms of its phase margin and its gain margin.

In addition, the bases of the transistors Q2 and Q4 are connected to a protection line comprising a resistor R28 mounted in series with a capacitor C4 connected to ground. This assembly is a voltage divider. In practice, the capacitor C4 behaves like a short circuit when the voltage running through the circuit is alternating. On the other hand, when the voltage running through the circuit is DC, the capacitor C4 behaves like an open circuit. In this case, the output of the high-power amplifier 100 is directly connected to the point S2. The voltage gain of the high-power amplifier 100 is then equal to 1, which makes it possible to limit a possible undesirable DC component on the voltage applied to the terminals of the loudspeaker R44.

Several embodiments are possible for the power supply circuit 151-155, 155a, 155b.

For all the following embodiments, the signal numbered 1 represents the gate signal of the MOSFET transistor M1, M2. The output signal numbered 3 represents the output signal of the amplifier, that is to say the signal at the terminals of the loudspeaker R44. The output signal numbered 2 represents the output signal of the power supply circuit 151-155, 155a, 155b, that is to say the signal present on the collector of the transistors Q8 and Q10.

In the remainder of the description, only the upper power supply circuit is illustrated but FIG. 5a-5b makes it possible to understand the positioning of the corresponding components for the lower power supply circuit.

Figure 6:
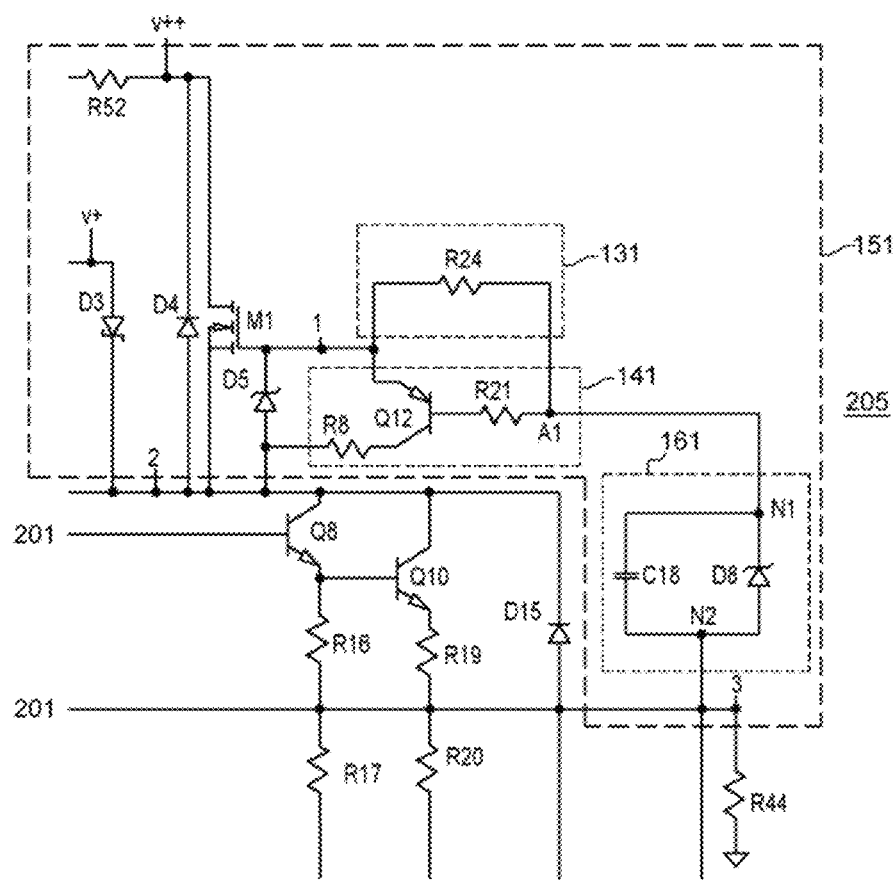
FIG. 6 is an electrical diagram of the power supply circuit of the high-power amplifier according to a second embodiment.

As illustrated in FIG. 6, in a first embodiment, the power supply circuit 151 comprises a MOSFET transistor M1, M2 which is directly connected to the first power bus V++ by its drain and to the second power bus V+ by its source via a fourth diode D3, D11, which can be a conventional diode or a Schottky diode. In practice, the anode of the fourth diode D3 is connected to the second power bus V+ and its cathode is connected to the output signal numbered 2 representing the output signal of the power supply circuit 151-155, 155a, 155b; the cathode of the fourth diode D11 is connected to the second power bus-V+. The MOSFET transistor M1, M2 is blocked for a voltage below a threshold, typically 35 V, then switches and operates linearly beyond this threshold. The MOSFET transistor M1, M2 allows the first power bus V++ to pass when a control voltage greater than the threshold value is applied to it. This voltage is controlled by the association of a sub-circuit for assisting with charging 131, a sub-circuit for assisting with discharging 141 and a voltage-shifting sub-circuit 161.

The sub-circuit for assisting with charging 131 comprises a first resistor R24, R31 connected between the gate of the MOSFET transistor M1, M2 and an interconnection point A1, A2.

The sub-circuit for assisting with discharging 141 comprises a transistor Q12, Q13 whose emitter is connected on the one hand to the gate of the MOSFET transistor M1, M2 and on the other hand to the sub-circuit for assisting with charging 131. The collector of the transistor Q12, Q13 is connected to output signal 2 of the power supply circuit 151 via the second resistor R8, R27. The base of the transistor Q12, Q13 is connected to the interconnection point A1, A2 via a third resistor R21, R39.

The voltage-shifting sub-circuit 161 comprises a first capacitor C18, C23 mounted in parallel with a first diode D8, D10. The cathode of the first diode D8 is connected to a first interconnection node N1 and the anode of the first diode D8 is connected to a second interconnection node N2. The diode D10 is connected in reverse, that is to say its cathode is connected to the interconnection node N3 and its anode is connected to the interconnection node N4, as shown in FIG. 5a-5b. The first interconnection node is connected to the interconnection point A1 and the second interconnection node is connected to the loudspeaker R44.

The voltage-shifting sub-circuit ensures that the gate potential of the MOSFET transistor M1 is always 15 V higher than that of the amplifier output.

In addition, the Darlington circuit consisting of the transistors Q8 and Q10 requires 5 V of drop-out voltage, that is to say the voltage equal to the difference between the input voltage on the collector of the transistor Q8 and the output voltage of the emitter of the transistor Q10. The MOSFET M1, on the other hand, requires 10 V of drop-out voltage, that is to say the voltage equal to the difference between the input voltage on its gate and the output voltage on its source in the case where the current is maximum and saturated. The voltage-shifting sub-circuit must therefore compensate for the voltage drops of the two bipolar transistors Q8 and Q10, as well as of the MOSFET M1, i.e. 5+10=15 V.

The power supply circuit 151 advantageously comprises a first protection diode D5, D13. The anode of diode D5 is connected to the output signal 2 of the power supply circuit 151 and its cathode is connected to the gate of the MOSFET transistor M1. The cathode of diode D13 is connected to the output of the power supply circuit 155b and its anode is connected to the gate of the MOSFET transistor M2. Likewise, the power supply circuit 151 includes a second protection diode D4, D12. The cathode of the diode D4 is connected to the source of the MOSFET transistor M1 and its anode is connected to the source of the MOSFET transistor M1. The cathode of the diode D12 is connected to the source of the MOSFET transistor M2 and its anode is connected to the drain of MOSFET transistor M2.

Figure 7:
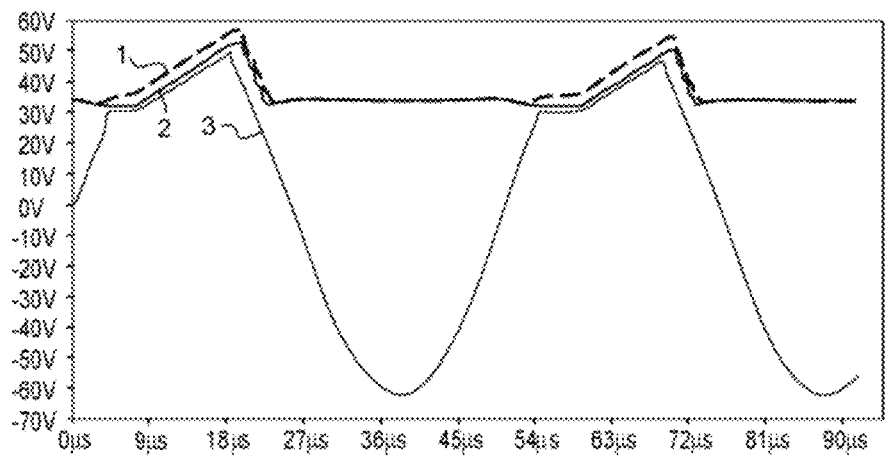
FIG. 7 is a graph representing the evolution of the gate voltage of the MOSFET transistor, the output voltage of the amplifier, and the output signal of the power supply circuit for the circuit of FIG. 6 with a sinusoid of frequency 20 kHz at the input.
Figure 8:
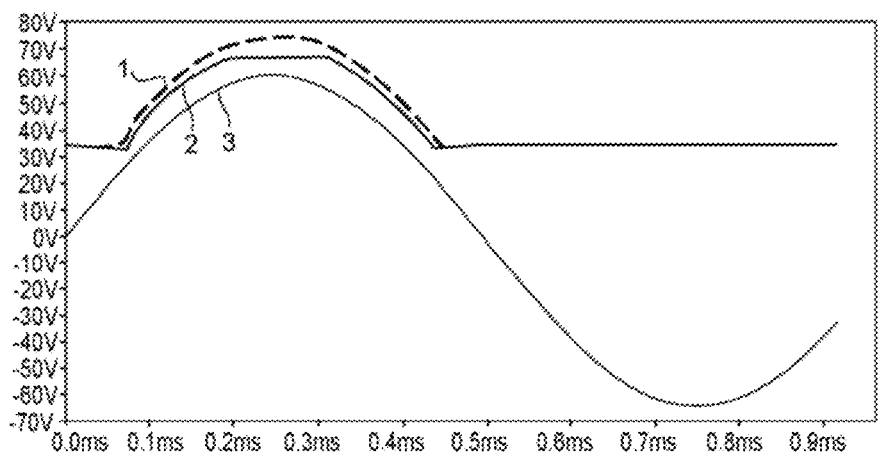
FIG. 8 is a graph representing the evolution of the gate voltage of the MOSFET transistor, the output voltage of the amplifier, and the output signal of the power supply circuit for the circuit of FIG. 6 with a sinusoid of frequency 1 kHz at the input.

With such an assembly, the different signals obtained are illustrated in FIGS. 7 and 8.

The signals illustrated in FIG. 7 correspond to the signals obtained with a sinusoid of frequency 20 kHz supplied at the input of the high-power amplifier 102.

We thus notice that the output signal 3 is distorted at the site of the vertices of the sinusoids which take on a triangular appearance. Thus, it is not possible to correctly reproduce a 20 kHz sinusoid. On the other hand, we do not observe abnormal voltage peaks. Power losses are therefore limited.

The signals illustrated in FIG. 8 correspond to the signals obtained with a sinusoid of frequency 1 kHz supplied at the input of the high-power amplifier 102.

We thus notice that the output signal 3 is less distorted than at 20 kHz. To the naked eye, the sinusoid of the output signal 3 even seems perfectly reproduced. However, it turns out that the harmonic distortion (THD) is greater than 0.1%.

Figure 9:
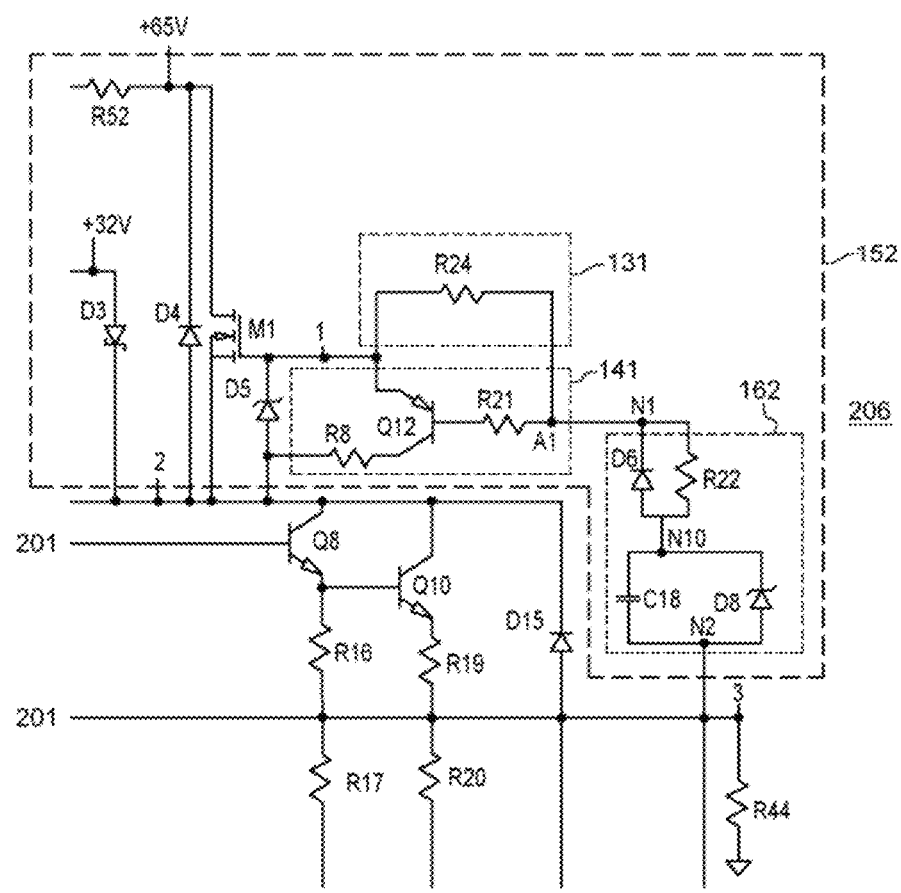
FIG. 9 is an electrical diagram of the power supply circuit of the high-power amplifier according to a third embodiment.

As illustrated in FIG. 9, in a second embodiment, the voltage-shifting sub-circuit 162 of the power supply stage 152 further comprises a second diode D6, D29 mounted in parallel with a fourth resistor R22, R26. The cathode of the second diode D6 is connected to the interconnection point N1 and the anode of the second diode D6 is connected to the third interconnection node N10. The diode D29 is connected in reverse, that is to say its cathode is connected to the interconnection node N20 and its anode is connected to the interconnection node N4, as illustrated in FIG. 5a-5b.

Figure 10:
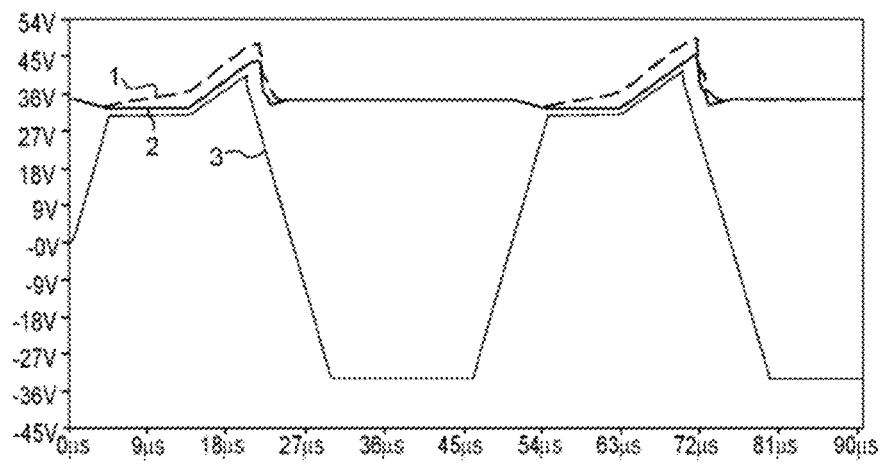
FIG. 10 is a graph representing the evolution of the gate voltage of the MOSFET transistor, the output voltage of the amplifier, and the output signal of the power supply circuit for the circuit of FIG. 9 with a sinusoid of frequency 20 kHz at the input.
Figure 11:
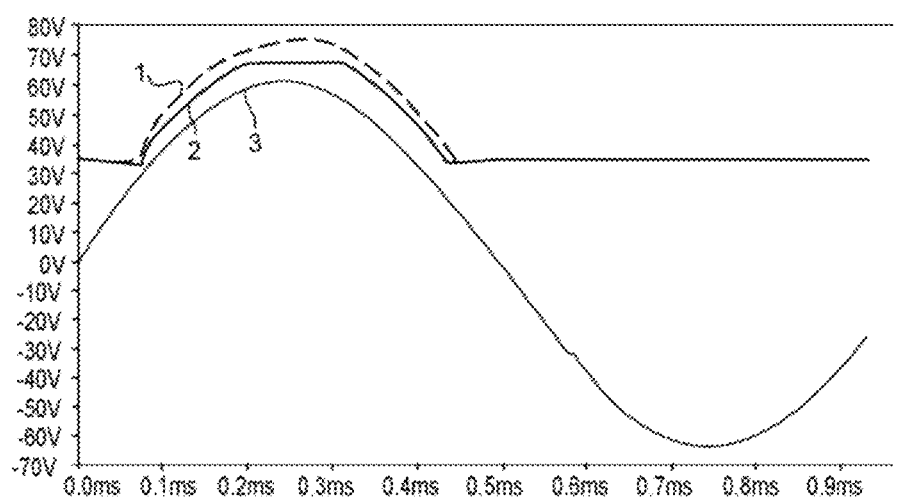
FIG. 11 is a graph representing the evolution of the gate voltage of the MOSFET transistor, the output voltage of the amplifier, and the output signal of the power supply circuit for the circuit of FIG. 9 with a sinusoid of frequency 1 kHz at the input.

With such an assembly, the different signals obtained are illustrated in FIGS. 10 and 11. The signals illustrated in FIG. 10 correspond to the signals obtained with a sinusoid of frequency 20 kHz supplied at the input of the high-power amplifier 102.

We thus notice that the output signal 3 is distorted at the site of the vertices of the sinusoids which take on a triangular appearance. Thus, it is not possible to correctly reproduce a 20 kHz sinusoid.

The signals illustrated in FIG. 11 correspond to the signals obtained with a sinusoid of frequency 1 kHz supplied at the input of the high-power amplifier 102.

To the naked eye, the sinusoid of the output signal 3 appears to be perfectly reproduced on the positive half-wave and slightly distorted on the negative half-wave. The harmonic distortion THD is equal to 0.45% because the observed distortion corresponds to the production of harmonics.

The addition of these components therefore does not help to reduce the distortions observed on the amplifier output signal. The addition of the second diode D6, D29 and the fourth resistor R22, R26 degrades the dynamic performance of the circuit. More complex circuitry is required for these components to be beneficial, that is to say for them to improve low frequency and high frequency degradation. To obtain a performance gain, it is possible to add other elements around the transistor Q12, Q13.

Figure 12:
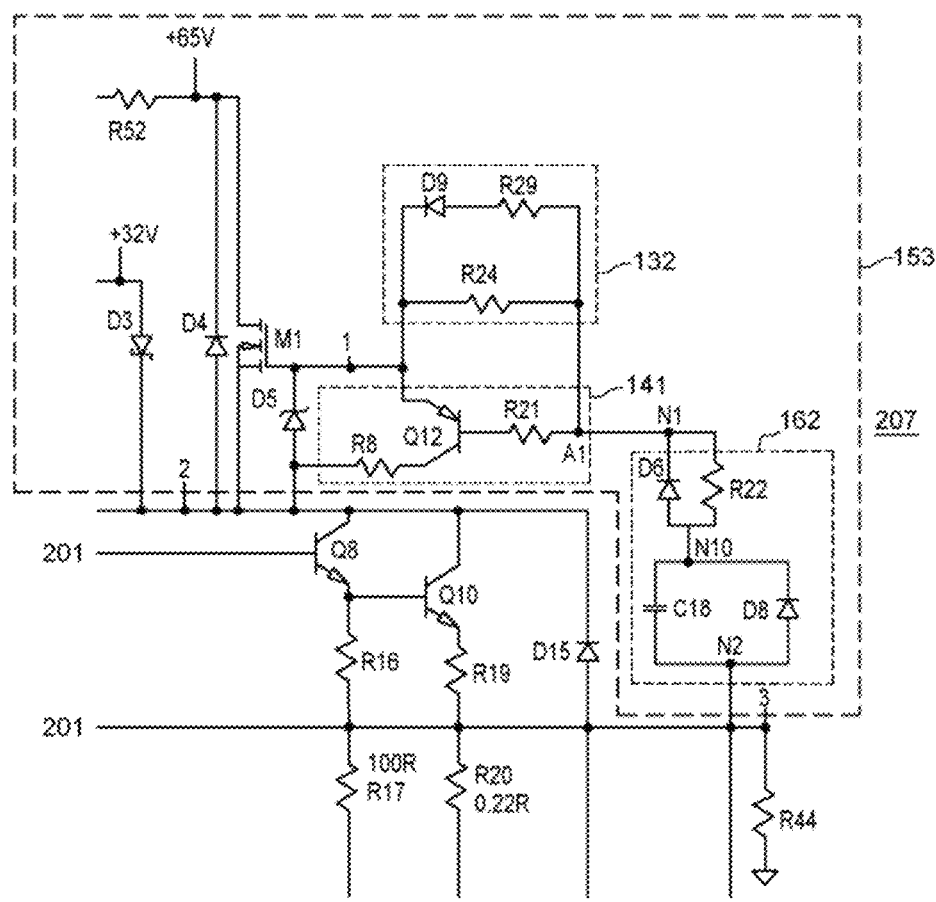
FIG. 12 is an electrical diagram of the power supply circuit of the high-power amplifier according to a fourth embodiment.

As illustrated in FIG. 12, in a third embodiment, the sub-circuit for assisting with the charging 132 of the power supply stage 153 further comprises a circuit branch comprising a third diode D9, D14 in series with a fifth resistor R29, R30, which is mounted in parallel with the first resistor R24, R31. The cathode of the third diode D9 is for example connected to the gate of the MOSFET transistor M1. The anode of the third diode D14 is connected to the gate of the MOSFET transistor M2. Alternatively, the components D9, R29 and D14, R30 can be reversed, so that the third diode D9, D14 is connected to the gate of the MOSFET transistor M1, M2 via the resistor R29, R30.

Figure 13:
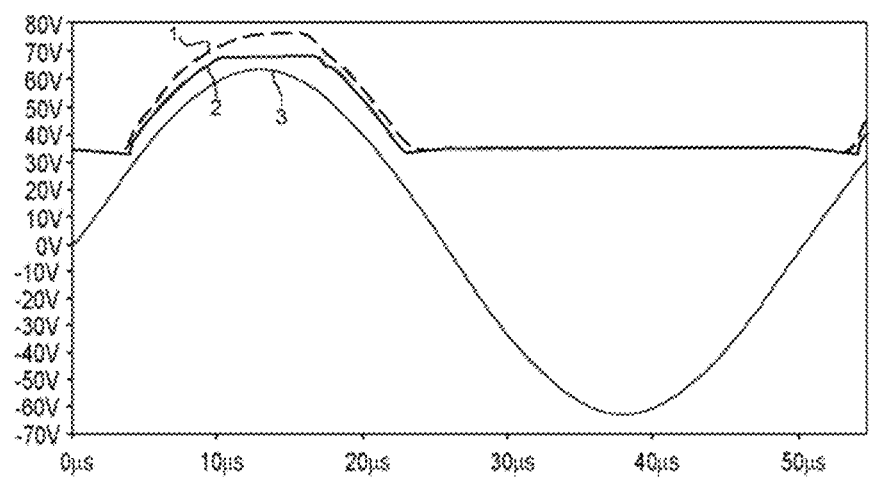
FIG. 13 is a graph representing the evolution of the gate voltage of the MOSFET transistor, the output voltage of the amplifier, and the output signal of the power supply circuit for the circuit of FIG. 12 with a sinusoid of frequency 20 kHz at the input.

With such an assembly, the different signals obtained are illustrated in FIG. 13. The latter correspond to the signals obtained with a sinusoid of frequency 20 kHz provided at the input of the high-power amplifier 102.

We observe that the output sinusoid corresponding to the output signal numbered 3 is well restored. On the other hand, the output signal 2, representing the output voltage of the power supply circuit 153, has distortions between 0 and 5 us and between 18 and 20 µs. The THD is equal to 0.26%. The addition of these components here makes it possible to improve the distortion for a sinusoidal input signal up to a frequency of 20 KHz.

Figure 14:
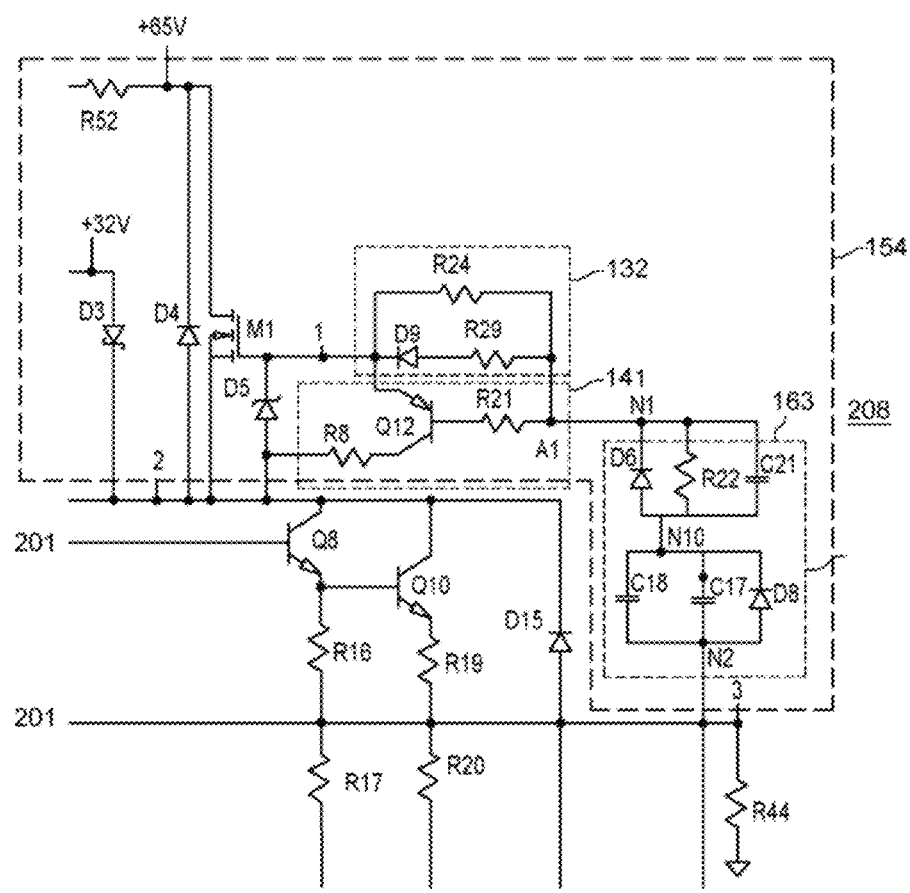
FIG. 14 is an electrical diagram of the power supply circuit of the high-power amplifier according to a fifth embodiment.

As illustrated in FIG. 14, in a fourth embodiment, the voltage-shifting sub-circuit of the power supply stage 154 further comprises a third capacitor C21, C24, which is mounted in parallel with the fourth resistor R22, R26 and the second diode D6, D29, as well as a second capacitor C17, C22, which is mounted in parallel with the first diode D8, D10 and the first capacitor C18, C23.

Figure 15:
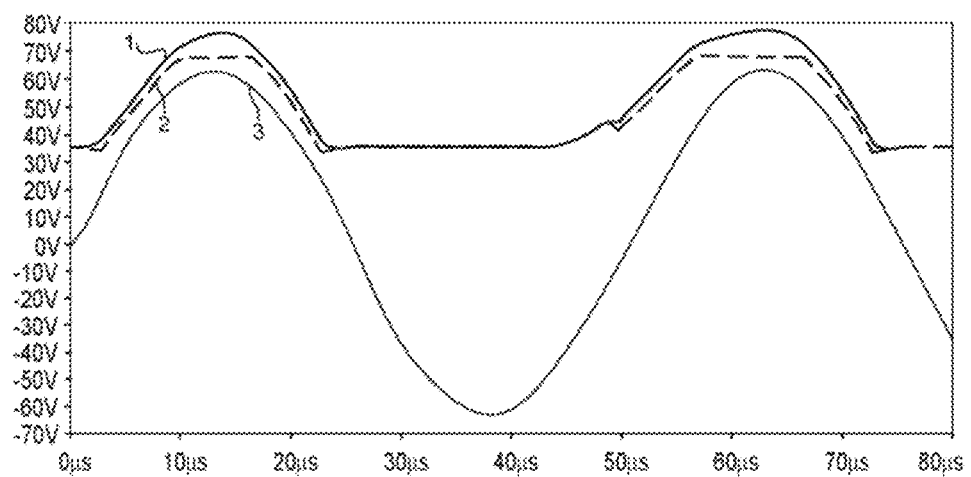
FIG. 15 is a graph representing the evolution of the gate voltage of the MOSFET transistor, the output voltage of the amplifier, and the output signal of the power supply circuit for the circuit of FIG. 14 with a sinusoid of frequency 20 kHz at the input.

The different signals obtained with such an assembly are illustrated in FIG. 15. The latter correspond to the signals obtained with a sinusoid of frequency 20 kHz supplied at the input of the high-power amplifier 102.

We thus observe that the signal 2 is less disturbed but the switching of the fourth diode D3 still generates interference, particularly between 45 and 50 µs.

Indeed, the second capacitor C17, C22, for example using the electrochemical technology, has a significant value, typically between 5 and 15 µF, and constitutes an energy reservoir, while the first capacitor C18, C23, for example using the electrochemical plastic film technology, has a lower value, typically between 50 and 150 nF, and makes it possible to smooth out high-frequency interference. The THD is reduced to 0.21%.

This association makes it possible to make the circuit more efficient in the transient phases of signal growth and decay.

Figure 16:
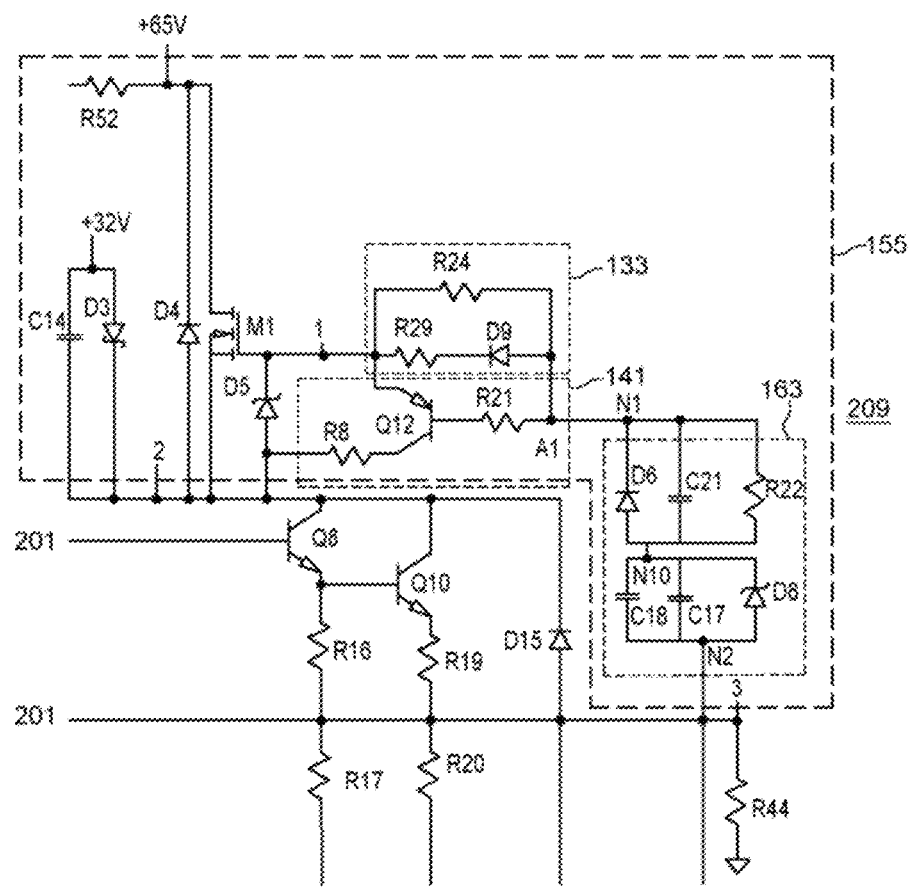
FIG. 16 is an electrical diagram of the power supply circuit of the high-power amplifier according to the first embodiment of FIG. 5.

As illustrated in FIGS. 5a-5b and 16, in a fifth embodiment, the power supply stage 155, 155a, 155b further comprises a fourth capacitor C14, C25 which is mounted in parallel with the fourth diode D3, D11.

Figure 17:
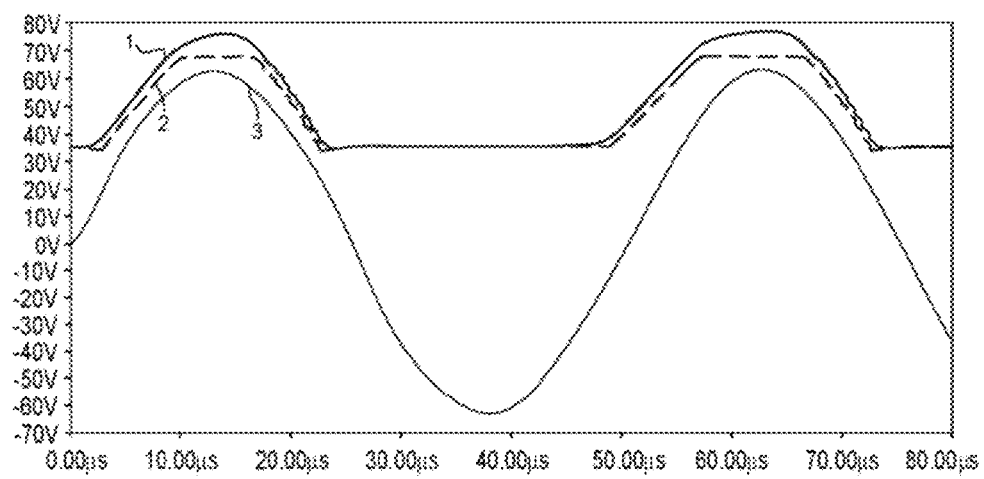
FIG. 17 is a graph representing the evolution of the gate voltage of the MOSFET transistor, the output voltage of the amplifier, and the output signal of the power supply circuit for the circuit of FIG. 16 with a sinusoid of frequency 20 kHz at the input, FIG. 18a and [FIG. 18b] are electrical diagrams of the high-power current amplifier according to an embodiment of the invention.

The different signals obtained with such assembly are illustrated in FIG. 17. The latter correspond to the signals obtained with a sinusoid of frequency 20 kHz supplied at the input of the high-power amplifier 102.

We observe that the interference generated by the fourth diode D3, D11 has disappeared between 45 and 50 µs. This results in a slight drop in the THD from 0.21 to 0.2%.

Although the invention has been described in the preceding with reference to FIGS. 5a-5b to 17 for a high-power audio amplifier 102 making it possible to supply a loudspeaker R44 with voltage, it is also possible to use the power supply circuit of the invention for a high-power current audio amplifier, that is to say to supply current to a loudspeaker.

Figure 18A:
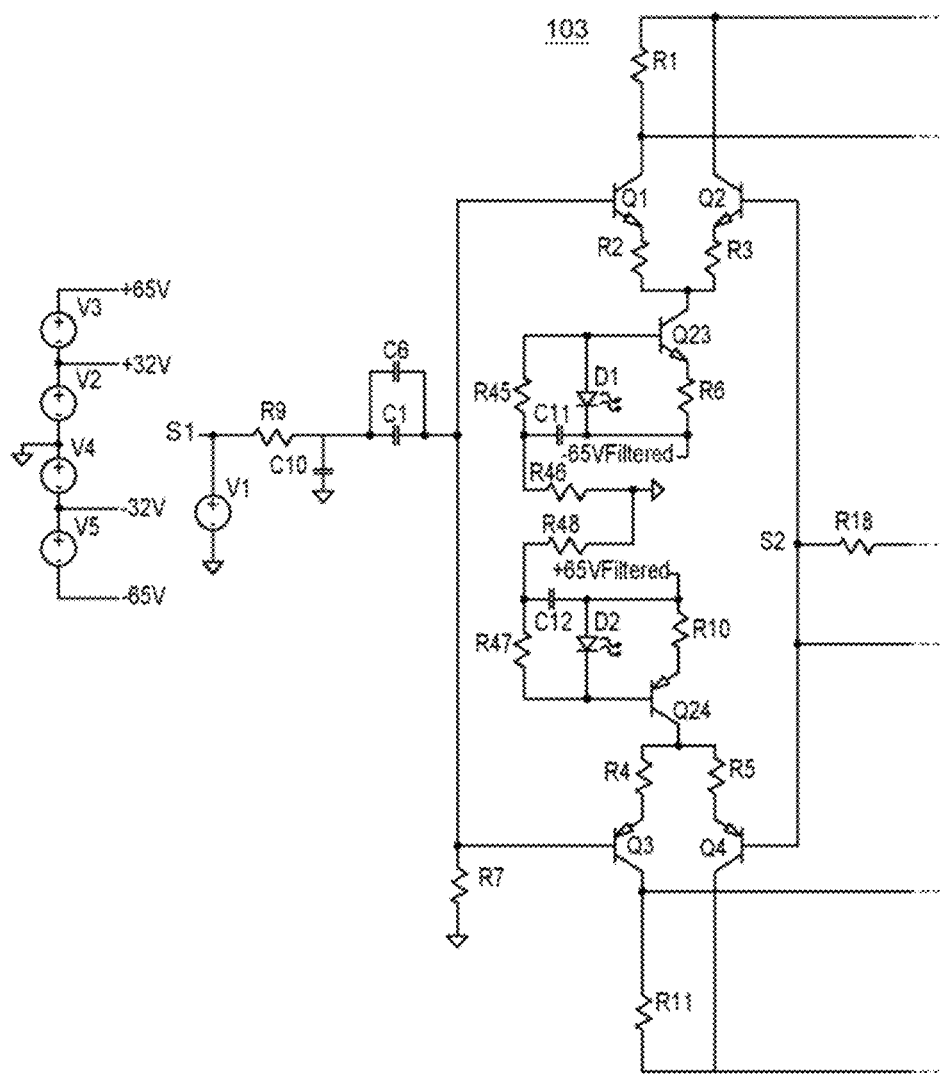
Figure 18B:
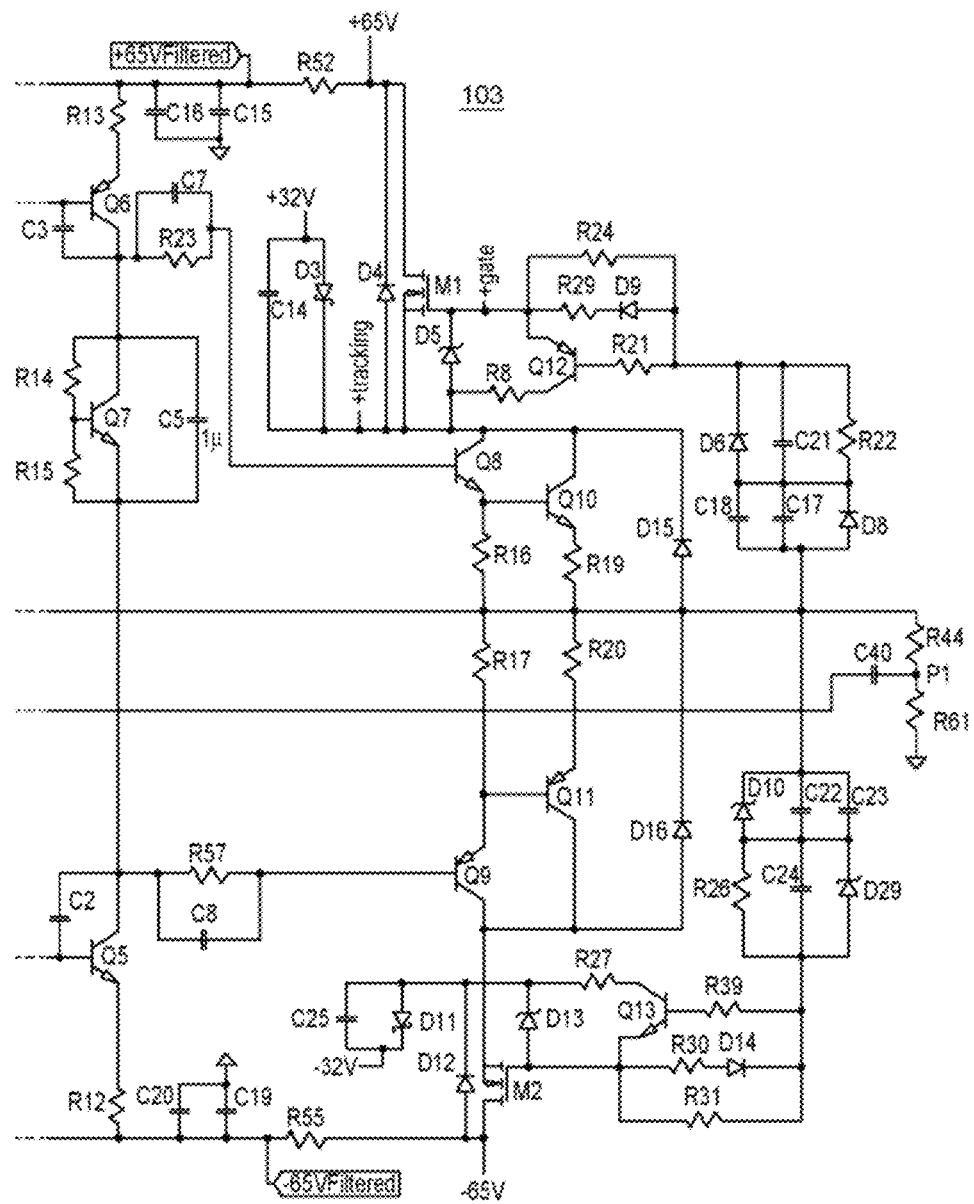

To do this, as illustrated in FIG. 18a-18b a current measurement resistor R61 is inserted between the loudspeaker R44 and ground. Furthermore, the current amplifier 103 does not have a protection line 403. The bases of the transistors Q2 and Q4 are connected to an interconnection point located between the resistor R61 and the loudspeaker R44 via a capacitor C40. This capacitor C40 therefore only allows the alternating component of the signal to pass.

In this configuration, the loudspeaker R44 is therefore traversed by an alternating current, an image of which is applied to point S2. It follows that the transconductance of the amplifier is equal to 1/R61 for an alternating signal.

Alternatively, in order to protect the loudspeaker R44 and the amplifier itself, a resistor can be added to the feedback, between point S2 and the output of the amplifier 3. In the case of a DC component at the terminals of the loudspeaker R44, the DC component is applied at the bases of the transistors Q2 and Q4 via a resistor R18. The feedback will tend to cancel this DC component. In addition, the resistor R18 helps limit the gain of the amplifier in the absence of loudspeaker R44, also preventing it from oscillating.

When the current is alternating, the capacitor C40 has a negligible impedance compared to the value of the resistor R18. In normal operation, that is to say, when there is no DC component and when a loudspeaker R44 is actually present at the amplifier output, the resistor R18 has almost no effect. On the other hand, in the absence of loudspeaker R44 at the amplifier output, we can consider that point S2 is connected, on the one hand, to the amplifier output via the resistor R18, and, on the other hand, to ground via the resistor R61 since the capacitor C40 behaves like an alternating current short circuit. The voltage amplification will therefore be limited to (R18+R61)/R61 since the output voltage of the amplifier multiplied by R61/(R18+R61) is compared to the input voltage applied at point S1 by the differential pairs formed by the transistors Q1/Q2 and Q3/Q4. The amplifier will then not supply its maximum output voltage, which could have been dangerous. Likewise, in the presence of a DC component and in the presence or absence of loudspeaker R44 at the output of the amplifier, the capacitor behaves like an open circuit, the DC component is thus reinjected at point S2 via the resistor R18. The voltage gain is thus limited to 1 for DC voltages, which does not risk damaging the loudspeaker R44.

Figure 19:
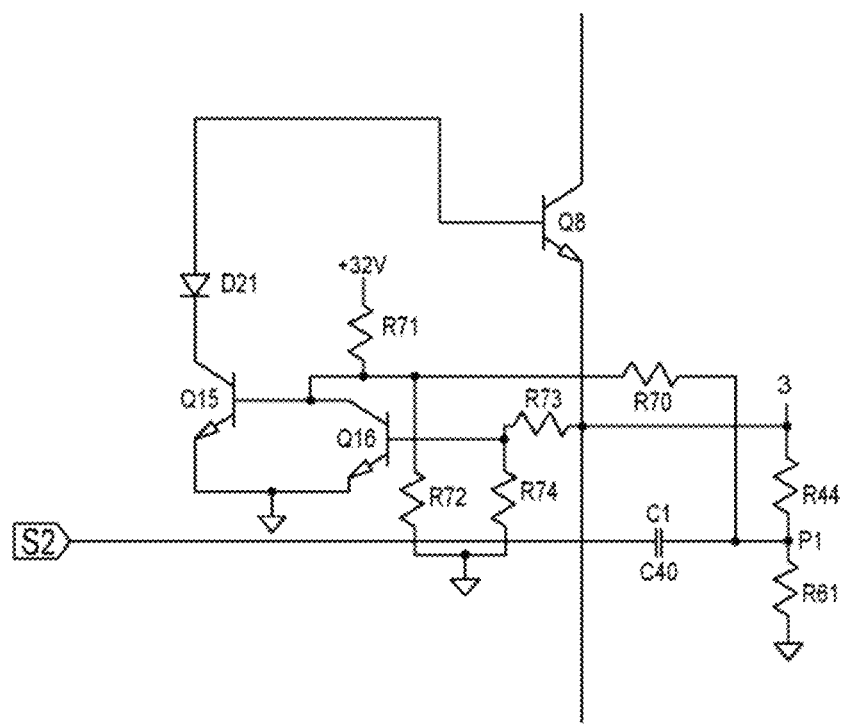
FIG. 19 is an electrical diagram of a protection structure of a high-power current amplifier according to an embodiment of the invention.

In another variant, a current amplifier protection circuit can be added. To do this, as illustrated in FIG. 19, the interconnection point P1 located between the resistor R61 and the loudspeaker R44 is connected to a first terminal of a resistor R70. In this embodiment, the second terminal of the resistor R70 is connected to the collector of a transistor Q16. The collector of the transistor Q16 is also connected to the base of a second transistor Q15. The voltage divider is made up of the resistors R71 and R72 makes it possible to adapt the current threshold starting from which the protection circuit acts. The first terminal of the resistor R71 is connected to the second power bus V+ with a value of 32 V. The second terminal of the resistor R71 is connected to the base of the transistor Q15 and to the collector of the transistor Q16. The first terminal of the resistor R72 is connected to the second terminal of the resistor R70 and the second terminal of the resistor R72 is connected to ground. The conduction threshold voltage of the transistor Q15 is thus shifted by: V+*R72/(R71+R72). This makes it possible to increase the sensitivity, that is to say that the current threshold from which the protection acts is lowered.

Preferably, the transistor Q15 is a Darlington transistor. This makes it possible to limit the distortion due to the circuit by drawing a lower current at the terminals of the measurement resistor R61 while maintaining sufficient sensitivity thanks to the divider network R71/R72. Another divider bridge made up of the resistors R73 and R74 is inserted between point 3 and ground. The first terminal of resistor R73 is connected to point 3. The second terminal of the resistor R73 is connected to the base of the transistor Q16 and to the first terminal of the resistor R74. The second terminal of the latter is connected to ground. Thus, the voltage threshold starting from which the current protection is neutralized is adapted. The emitters of the transistors Q16 and Q15 are connected together and to ground, and the collector of the transistor Q15 is connected to the base of the transistor Q8 via a diode D21, the cathode of which is connected to the collector of the transistor Q15.

This circuit must be mirror-duplicated to manage the current protection during negative half-wave, the NPN transistors are then replaced by PNP transistors.

This circuit makes it possible to limit the risks of power failure of the current amplifier, particularly when it is overloaded or when its output is short-circuited. Indeed, in these cases, the product of the output current and the voltage of the power buses will be entirely dissipated by the transistors and they could be damaged.

With the circuit of FIG. 19, if the current in the current measurement resistor R61 is sufficient to turn on the transistor Q15, the latter can, via the diode D21, evacuate the signal coming from the base of the transistor Q8 towards ground, so as to block it. On the other hand, if the voltage at the terminals of the loudspeaker R44 is sufficient to turn on the transistor Q16, the signal coming from the base of the transistor Q15 will be diverted to ground and it is the latter transistor which will be blocked. The protection circuit is thus neutralized in the presence of sufficient voltage at the amplifier output.

To conclude, the invention makes it possible to obtain a high-power audio amplifier making it possible to limit the distortions identified on the signals and thus to improve the efficiency and reduce the saturation of the amplifier.

The invention claimed is:

1. A high-power audio amplifier intended to control at least one loudspeaker, said amplifier comprising:
    a pre-amplification stage that receives an input signal;
    a power amplification stage, which is connected to the pre-amplification stage and supplies an output signal intended to power said at least one loudspeaker; the pre-amplification and power amplification stages comprising an upper part and a lower part mounted mirroring each other;
    a feedback supplying the pre-amplification stage with an image of the output signal,
    an upper power supply circuit, which is connected to the upper part of the power amplification stage, and enabling it to be powered by a first or a second power bus;
    a lower power supply circuit, which is connected to the lower part of the power amplification stage, and enabling it to be powered by a first or a second power bus;
    each power supply circuit comprising a MOSFET transistor and monitoring means, the MOSFET transistor being controlled by a supervision means so as to carry out switching between one or the other of the two power buses, the MOSFET transistor being connected to the second power bus via a fourth diode of which a first terminal is connected to the source of the MOSFET transistor, and a drain of the MOSFET transistor being connected to the first power bus, characterized in that each power supply circuit further comprises:
    a sub-circuit for assisting with charging said MOSFET transistor, comprising at least a first resistor, a first terminal of the first resistor being connected to a gate of the MOSFET transistor and a second terminal of the first resistor connected being to an interconnection point;
    a sub-circuit for assisting with discharging said MOSFET transistor comprising at least a second and a third resistor and a bipolar transistor; a base of the bipolar transistor being connected to a first terminal of the third resistor, its emitter being connected to the gate of the MOSFET transistor and its collector being connected to the source of the MOSFET transistor via the second resistor, a second terminal of the third resistor being connected to the interconnection point; and a voltage-shifting sub-circuit comprising a first diode mounted in parallel with a first capacitor; a first terminal of the first diode and a first terminal of the first capacitor being connected to a first interconnection node, which is itself connected to said interconnection point of said sub-circuit for assisting with discharging; a second terminal of the first diode and a second terminal of the first capacitor being connected to a second interconnection node, which is itself connected to said output signal.

2. The amplifier according to claim 1, characterized in that the voltage-shifting sub-circuit further comprises at least a fourth resistor and a second diode, which are mounted in parallel, a first terminal of the second diode and a terminal of the fourth resistor being connected to the interconnection point, a second terminal of the fourth resistor and a second terminal of the second diode being connected to a third interconnection node.

3. The amplifier according to claim 1, characterized in that the sub-circuit for assisting with charging further comprises a fifth resistor, which is mounted in series with a third diode, the fifth resistor and the third diode being mounted in parallel with a branch of the sub-circuit for assisting with charging including the first resistor.

4. The amplifier according to claim 1, characterized in that the voltage-shifting sub-circuit further comprises a second capacitor and a third capacitor, the second capacitor being mounted in parallel with the first capacitor and the first diode and the third capacitor being mounted in parallel with the second diode and a fifth resistor.

5. The amplifier according to claim 1, characterized in that each power supply circuit comprises a first protection diode of which a first terminal is connected to the source of the MOSFET transistor and of which a second terminal of which is connected to the gate of the MOSFET transistor.

6. The amplifier according to claim 1, characterized in that each power supply circuit further comprises a second protection diode connected between the source and the drain of the MOSFET transistor.

7. The amplifier according to claim 1, characterized in that each power supply circuit further comprises a fourth capacitor mounted in parallel with the fourth diode.

8. The amplifier according to claim 1, characterized in that the pre-amplification stage is connected to the first power bus of each power circuit by means of a power variation damping circuit of said first power bus, said power variation damping circuit comprising at least one capacitor and at least one resistor which are mounted as low-pass filter.

9. The amplifier according to claim 8, characterized in that said power variation damping circuit further comprises an additional capacitor mounted in parallel with the at least one capacitor.

10. The amplifier according to claim 1, characterized in that the feedback applied to the pre-amplification stage supplies a signal proportional to the current passing through the loudspeaker.

* * * * *